US011999632B2

(12) United States Patent
Jang et al.

(10) Patent No.: US 11,999,632 B2
(45) Date of Patent: Jun. 4, 2024

(54) QUANTUM DOT, DISPLAY PANEL AND DISPLAY DEVICE

(71) Applicant: LG Display Co., Ltd., Seoul (KR)

(72) Inventors: KyungKook Jang, Paju-si (KR); DaBin Kim, Paju-si (KR); SeungRyong Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 66 days.

(21) Appl. No.: 17/534,328

(22) Filed: Nov. 23, 2021

(65) Prior Publication Data

US 2022/0194810 A1 Jun. 23, 2022

(30) Foreign Application Priority Data

Dec. 23, 2020 (KR) .................. 10-2020-0182633

(51) Int. Cl.
| | |
|---|---|
| *C09K 11/56* | (2006.01) |
| *C01G 9/00* | (2006.01) |
| *C01G 9/08* | (2006.01) |
| *C01G 15/00* | (2006.01) |
| *C09K 11/02* | (2006.01) |
| *C09K 11/70* | (2006.01) |
| *C09K 11/88* | (2006.01) |
| *G02B 5/20* | (2006.01) |
| *H01L 33/50* | (2010.01) |
| *H10K 59/38* | (2023.01) |
| *B82Y 20/00* | (2011.01) |
| *B82Y 35/00* | (2011.01) |
| *B82Y 40/00* | (2011.01) |

(52) U.S. Cl.
CPC .............. *C01G 9/08* (2013.01); *C01G 9/006* (2013.01); *C01G 15/00* (2013.01); *C09K 11/565* (2013.01); *C09K 11/70* (2013.01); *C09K 11/883* (2013.01); *G02B 5/20* (2013.01); *H01L 33/502* (2013.01); *H10K 59/38* (2023.02); *B82Y 20/00* (2013.01); *B82Y 35/00* (2013.01); *B82Y 40/00* (2013.01); *C01P 2004/64* (2013.01); *C01P 2006/60* (2013.01); *G02B 2207/101* (2013.01); *H01L 2933/0041* (2013.01)

(58) Field of Classification Search
CPC ..... C09K 11/565; C09K 11/56; C09K 11/562; C09K 11/70; C09K 11/703; C09K 11/701; C09K 11/74; C09K 11/7414; C09K 11/7492; C09K 11/75; C09K 11/752; C09K 11/88; C09K 11/883; C09K 11/892; C09K 11/02; C09K 11/025; C09K 11/08; C09K 11/0811; H01L 33/502; H01L 33/504; H01L 33/507; G02F 1/133614; G02F 2202/36; G02B 5/20
See application file for complete search history.

(56) References Cited

U.S. PATENT DOCUMENTS

2018/0119007 A1* 5/2018 Ippen .................. C09K 11/883
2021/0147749 A1* 5/2021 Kim .................. G02F 1/133509

* cited by examiner

*Primary Examiner* — Matthew E. Hoban
*Assistant Examiner* — Lynne Edmondson
(74) *Attorney, Agent, or Firm* — Seed IP Law Group LLP

(57) ABSTRACT

A quantum dot includes a core, a first shell and a second shell. The core includes a group III-V compound. The first shell includes a second semiconductor nanocrystal. The second semiconductor nanocrystal includes zinc, selenium and a dopant including tellurium. The second shell includes a third semiconductor nanocrystal. The third semiconductor nanocrystal includes a II-VI compound.

9 Claims, 8 Drawing Sheets

QUANTUM DOT, DISPLAY PANEL AND DISPLAY DEVICE

CROSS REFERENCE TO RELATED APPLICATION

This application claims priority from Korean Patent Application No. 10-2020-0182633, filed on Dec. 23, 2020, which is hereby incorporated by reference for all purposes as if fully set forth herein.

BACKGROUND

Technical Field

Embodiments of the present disclosure relate to a quantum dot, a display panel and a display device.

Description of the Related Art

A quantum dot of nanoparticles emits light by photoluminescence (PL), in which electrons in an excited state by external light come down from the conduction band to the valence band to emit light or electroluminescence (EL) which emits light by an external charge. The quantum dot has a property of emitting light of different wavelengths according to the size of the diameter of the nanoparticles. Due to these properties, the quantum dot is being applied to a display device and the like.

The quantum dot may be used in a wavelength conversion layer or a color changing material that converts the wavelength of light emitted from a backlight unit. Alternatively, the quantum dot may be used in the wavelength conversion layer that converts the wavelength of light emitted from an organic light emitting panel.

BRIEF SUMMARY

The inventors have realized that when the quantum dot is used in the wavelength conversion layer, there is a problem in that light conversion efficiency is low. In particular, the quantum dot that converts blue external light into green light has a problem in that light conversion efficiency is very low.

One or more embodiments of the present disclosure may provide a quantum dot with improved light conversion efficiency.

In addition, one or more embodiments of the present disclosure may provide a display panel and a display device including the quantum dot having the improved light conversion efficiency.

According to one or more embodiments of the present disclosure, provided is a quantum dot including a core including a first semiconductor nanocrystal, a first shell including a second semiconductor nanocrystal and a dopant of tellurium (Te), and a second shell including a third semiconductor nanocrystal.

According to another embodiment of the present disclosure, provided is a display device, including a light source and a wavelength conversion layer including the above-mentioned quantum dot.

According to another embodiment of the present disclosure, provided is a display device, including the above-mentioned display panel and a controller configured to control the display panel.

According to the one or more embodiments of the present disclosure, the quantum dot, the display panel, and the display device may have improved light conversion efficiency.

It will be appreciated by persons skilled in the art that the effects that may be achieved with the present disclosure are not limited to what has been particularly described hereinabove and other advantages of the present disclosure will be more clearly understood from the following detailed description taken in conjunction with the accompanying drawings.

DESCRIPTION OF THE SEVERAL VIEWS OF THE DRAWINGS

The above and other technical benefits, features, and advantages of the present disclosure will be more clearly understood from the following detailed description, taken in conjunction with the accompanying drawings, in which.

DETAILED DESCRIPTION

Figure 1:
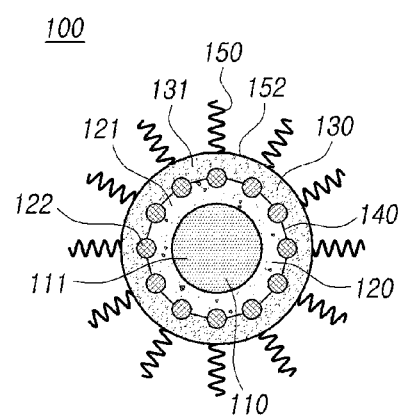
FIG. 1 illustrates a quantum dot according to embodiments of the present disclosure.

In the following description of examples or embodiments of the present disclosure, reference will be made to the accompanying drawings in which it is shown by way of illustration specific examples or embodiments that may be implemented, and in which the same reference numerals and signs may be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only may the first element "be directly connected or coupled to" or "directly contact or overlap" the second element, but a third element may also be "interposed" between the first and second elements, or the first and second elements may "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "may."

As used herein, "Group" refers to a group in the periodic table of elements.

"Group II" or "Group 2" may include Groups IIA (or 2A) and IIB (or 2B), and examples of Group II metals include Cd, Zn, Hg and Mg, but it is not limited thereto.

"Group III" or "Group 3" may include Groups IIIA (or 3A) and IIIB (or 3B), examples of Group III metals include Al, In, Ga, and Tl, but it is not limited thereto.

"Group IV" may include Groups IVA and IVB, and examples of Group IV metals may include Si, Ge, Sn, but it is not limited thereto.

"Group I" may include Groups IA and IB, and include Li, Na, K, Ru, Cs, but it is not limited thereto.

As used herein, "doping" refers to the inclusion of a dopant (e.g., as an intralattice or interstitial element) without substantially changing the original crystal structure. For example, dopant atoms may be substituted in the crystal structure of interest or may be present in crystal lattice interstices. The dopant element may not substantially exhibit a crystalline peak in the X-ray diffraction spectrum. The presence (or content) of the dopant element may be confirmed by X ray photoelectron spectroscopy, energy dispersive X ray spectroscopy, ICP-AES, or TOF-SIMS.

A quantum dot according to embodiments of the present disclosure may have a multi-layer structure including a core/shell structure.

With reference to the attached drawings, various embodiments of the present disclosure will be described in detail.

FIG. 1 illustrates a quantum dot according to embodiments of the present disclosure.

Referring to FIG. 1, the quantum dot 100 according to embodiments of the present disclosure may have a core/multi-shell structure including two or more shells.

The quantum dot 100 is a core 110 including a first semiconductor nanocrystal 111, a first shell 120 including a second semiconductor nanocrystal 121 and a dopant of tellurium (Te) 122, and a second shell 130 including a third semiconductor nanocrystal 131.

The core 110 includes the first semiconductor nanocrystal 111. The first semiconductor nanocrystal 111 includes a group III-V compound. The group III-V compounds include, for example, boron phosphide (BP), aluminum phosphide (AlP), aluminum arsenide (AlAs), aluminum antimonide (AlSb), gallium nitride (GaN), gallium phosphide (GaP), Gallium Arsenide (GaAs), Gallium Antimonide (GaSb), Indium Nitride (InN), Indium Phosphide (InP), Indium Arsenide (InAs), Indium Antimonide (InSb), Aluminum Nitride (AlN), Boron Nitride (BN) and the like.

For example, the first semiconductor nanocrystal 111 may include indium (In) and phosphorus (P). In an example, the first semiconductor nanocrystals 111 may include indium phosphide (InP).

The first shell 120 includes the second semiconductor nanocrystal 121 and the dopant of tellurium (Te).

The second semiconductor nanocrystal 121 includes zinc (Zn) and selenium (Se). The second semiconductor nanocrystal may include, for example, zinc selenide (ZnSe). In this example, the second shell 120 may be expressed as ZnSe:Te. That is, in the second shell 120, tellurium (Te) is not included by alloying with the second semiconductor nanocrystal 121, but is included as a dopant. When the second shell 120 includes the second semiconductor nanocrystals 121 including zinc (Zn) and selenium (Se) and the dopant of tellurium (Te), the quantum dot 100 may have excellent light conversion efficiency.

The dopant of tellurium (Te) may be positioned at the interface 140 between the first shell 120 and the second shell 130. The interface 140 may mean a boundary between the first shell 120 and the second shell 130.

The first shell 120 may include tellurium (Te) in an amount of 1% to 50% with respect to selenium (Se) included in the first semiconductor nanocrystal 121 and tellurium (Te) doped in the first semiconductor nanocrystal 121. The lower limit of the content of the tellurium (Te) may be, for example, 5% or 8%. The upper limit of the content of the tellurium (Te) may be, for example, 25% or 12%. When the content of tellurium (Te) included in the first shell 120 satisfies the above range, it is possible to provide the quantum dot 100 with high light conversion efficiency while reducing the thickness of the first shell 120.

The first shell 120 may include tellurium (Te) in an amount of 6% to 35% with respect to zinc (Zn) included in the first semiconductor nanocrystal 121 and tellurium (Te) doped in the first semiconductor nanocrystal 121. The lower limit of the content of tellurium (Te) may be, for example, 7% or 9%. The upper limit of the content of tellurium (Te) may be, for example, 25% or 10%. When the content of tellurium (Te) included in the first shell 120 satisfies the above range, it is possible to provide the quantum dot 100 with high light conversion efficiency while reducing the thickness of the first shell 120.

The third shell 130 includes the third semiconductor nanocrystal 131. The third semiconductor nanocrystal 131 includes a group II-VI compound. The Group II-VI compound include, for example, magnesium sulfide (MgS), magnesium selenide (MgSe), magnesium telluride (MgTe), calcium sulfide (CaS), calcium selenide (CaSe), calcium telluride (CaTe), strontium sulfide (SrS), strontium selenide (SrSe), strontium telluride (SrTe), cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe) and the like.

For example, the third semiconductor nanocrystal 131 may include zinc (Zn) and sulfur (S). In another example, the third semiconductor nanocrystals 131 may include zinc sulfide (ZnS).

As an example, the quantum dot 100 may include the core 110 of InP, the first shell 120 of ZnSe/ZnSe:Te, and the second shell 130 of ZnS. In particular, the first shell 120 may be expressed as ZnSe/ZnSe:Te in order to indicate that tellurium (Te) is doped into the ZnSe semiconductor nanocrystals, and tellurium (Te) is positioned at the interface between the first shell 120 and the second shell 130. In this example, the quantum dot 100 may be expressed as InP/ZnSe/ZnSe:Te/ZnS.

The quantum dot 100 includes the core 110, the first shell 120 and the second shell 130 as described above, so that it may have a maximum emission wavelength λmax of 540 nm to 550 nm when light having a wavelength of 440 nm to 460 nm is irradiated to it. In addition, the quantum dot 100 may have a quantum yield of 86% or more and a half width of 40 nm or less.

When the quantum dot 100 includes the core 110, the first shell 120 and the second shell 130 as described above, it is possible to synthesize it in a colloidal state so that its manufacturing process may be easy.

The quantum dot according to the embodiments of the present disclosure may be a non-cadmium-based quantum dot that does not include heavy metals such as cadmium, lead, arsenic, and mercury. The fact that the quantum dot 100 according to embodiments of the present disclosure do not include heavy metals such as cadmium, lead, arsenic, and mercury may mean that a material constituting the quantum dots as nanoparticles do not include heavy metals such as cadmium, lead, arsenic and mercury. Accordingly, the quantum dot 100 according to the embodiments of the present disclosure may have an excellent eco-friendly effect.

The quantum dot 100 may include a ligand 150 located on the surface 152. The ligand 150 may be bound to the surface 152 of the quantum dot 100. The ligand 150 is RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, wherein R and R' are each independently to C1 to C24 substituted or unsubstituted aliphatic hydrocarbon such as C1 to C24 alkyl group, C2 to C24 alkenyl group, C2 to C24 alkynyl group and the like, and C6 to C20 substituted or unsubstituted aromatic hydrocarbon such as C6 to C20 aryl group, or a combination thereof.

The ligand 150 coordinates the surface 152 of the prepared quantum dot 100, and may make the quantum dot 100 well dispersed in solution or affect the light emission and electrical properties of the quantum dot 100.

As an example, the ligand 150 may include methane thiol, ethane thiol, propane thiol, butane thiol, pentane thiol, hexane thiol, octane thiol, dodemaye thiol, hexademaye thiol, octademaye thiol, benzyl thiol; methanamine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodemayoic acid, hexademayoic acid, octademayoic acid, oleic acid, benzoic acid; substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphines such as phosphine, substituted or unsubstituted butyl phosphine, substituted or unsubstituted pentyl phosphine, substituted or unsubstituted octylphosphine (e.g., trioctylphosphine (TOP)); substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphine oxide, etc.), substituted or unsubstituted propyl phosphine oxide, substituted or unsubstituted butyl phosphine oxide, substituted or unsubstituted octylphosphine oxide (e.g., phosphine oxide such as trioctylphosphine oxide (TOPO); diphenyl phosphine, tri a phenyl phosphine compound, or an oxide compound thereof, phosphonic acid, and the like, but it is not limited thereto. The ligand 150 may be used alone or as a mixture of two or more thereof.

The particle diameter to the outermost shell of the quantum dot 100, except for the ligand 150, may be 1 nm to 30 nm.

Although the quantum dot 100 according to an embodiment have been described above, there will be described a display panel according to embodiments of the present disclosure using the quantum dot 100.

Figure 2:
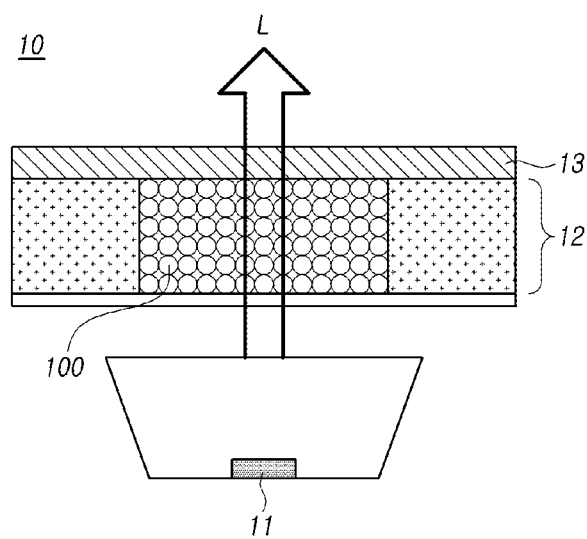
FIG. 2 schematically illustrates a display panel according to embodiments of the present disclosure.

FIG. 2 schematically illustrates a display panel according to embodiments of the present disclosure.

Referring to FIG. 2, the display panel 10 according to embodiments of the present disclosure includes a light source 11 and a wavelength conversion layer 12. The display panel 10 further include a color filter 13 on the wavelength conversion layer 12.

The light source 11 emits light, and the type thereof is not particularly limited. For example, the light source 11 is a light emitting device LED, a micro LED, an organic light emitting device OLED and the like.

The light L emitted by the light source 11 includes light with a specific wavelength such as 450 nm and has a first color. That is, the wavelength band of the light emitted by the light source 11 includes 450 nm, and the emitted light may be visually recognized as the first color.

The wavelength conversion layer 12 is positioned on the path of the light L emitted from the light source 11. The fact that the wavelength conversion layer 12 is located on the path of the light emitted from the light source 11 means that the wavelength is changed by the wavelength conversion layer 12 before the light L emitted from the light source 11 is visually recognized from the outside. It means that the wavelength conversion layer 12 is located at a position that may be converted.

As an example, the wavelength conversion layer 12 may convert the wavelength of light emitted from a backlight unit (or, "backlight structure"). As another example, the wavelength conversion layer 12 may convert the wavelength of light emitted from an organic light emitting device OLED.

The wavelength conversion layer 12 includes the quantum dots 100. In the display panel 10 according to the embodiments of the present disclosure, the quantum dots 100 may be the same as those described for the quantum dots according to the embodiments of the present disclosure unless otherwise described.

Since the wavelength conversion layer 12 includes the quantum dots 100, the wavelength conversion layer 12 converts the first color of the light L into a second color. For example, the first color of the light L may be blue, and the second color may be green. In this example, the quantum dots 100 may convert blue light to green light with good efficiency.

The color filter 13 may be a second color filter positioned on the path of the light converted to the second color. For example, when the first color is blue and the second color is green, the color filter 13 may be a green color filter. The color filter 13 may improve the color purity of the second color emitted from the wavelength conversion layer 12.

Figure 3:
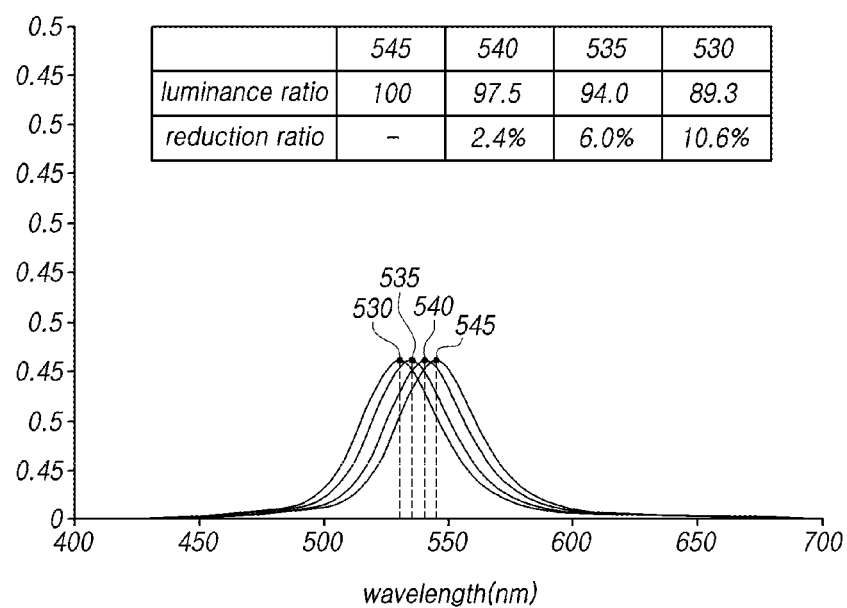
FIG. 3 is a graph of luminance ratio of the display panel in FIG. 2 according to the change of the maximum emission wavelength of the quantum dot.

FIG. 3 is a graph of luminance ratio of the display panel in FIG. 2 according to the change of the maximum emission wavelength λmax of the quantum dot.

Referring to FIGS. 2 and 3, it may be seen that the luminance ratio according to the change of the maximum emission wavelength max of the quantum dot 100. It may be seen that the highest luminance is obtained when the maximum emission wavelength max of the quantum dot 100 is 545 nm, and the luminance further decreases as a blue shift occurs when the maximum emission wavelength max of the quantum dot 100 is shorter than 545 nm.

Since the quantum dot 100 according to embodiments of the present disclosure have the maximum emission wavelength max of 540 nm to 550 nm, the display panel 10 according to embodiments of the present disclosure including such quantum dot 100 may have high luminance.

Figure 4:
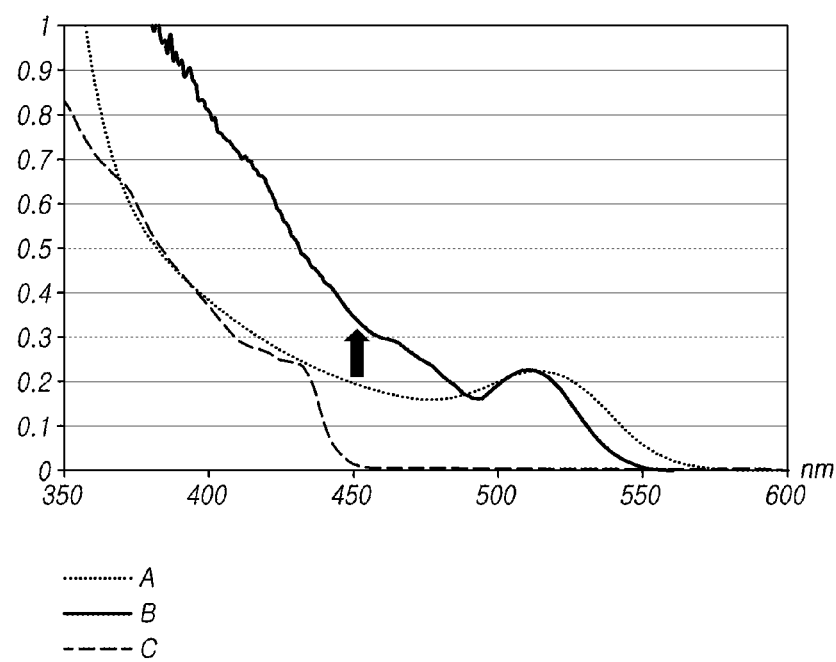
FIG. 4 is a block diagram of a display device according to embodiments of the present disclosure.

FIG. 4 is a block diagram of a display device according to embodiments of the present disclosure.

Referring to FIG. 4, a display device 200 according to embodiments of the present disclosure may include a display panel 210 and a controller 220 for controlling the display panel 210. The controller 220 may be control circuitry 220, and may be referred to as control circuitry 220.

Since the display panel 210 in the display device 200 according to the embodiments of the present disclosure is substantially the same as the display panel 10 according to the above-described embodiments of the present disclosure. The controller 220 may be one of a timing controller, a driving circuit, and a combination thereof. The timing controller may be timing circuitry, and may be referred to as timing circuitry.

Hereinafter, examples will be given with respect to the synthesis examples of the compounds and the manufacturing examples of the quantum dot 100 according to the embodiments of the present disclosure, but it is not limited thereto.

SYNTHESIS EXAMPLE

Embodiment: Quantum Dot of InP/ZnSe/ZnSe:Te/ZnS 1) 1 mmol of Indium Acetate, 1 mmol of Zn Acetate, 5 mmol of Palmitic acid, 30 mL of 1-Octadecene are mixed and vacuum stirred at 120° C. for 1 hour. 2) 1 mmol of Tris(trimethylsilyl) Phosphine is injected into the reactant of a nitrogen environment at 300° C. to let it grow for 10 minutes. 3) 0.1 mmol of Selenium and 1 mL of Trioctylphosphine (TOP) is added to the reactant and stirred at 300° C. for 10 minutes. 4) A mixed solution of 1 mmol of Zn Acetate, 3 mmol of Oleic acid, 0.9 mmol of Selenium, and 10 mL of TOP is injected into the reactant at 320° C. and stirred for 10 minutes. 5) A mixed solution of 0.1 mmol of Tellurium, 0.8 mL of Trioctylphosphine, and 0.2 mL of Diphenylphosphine is injected into the reactant at 300° C. 6) A mixed solution of 0.9 mmol of Zn Acetate, 2.7 mmol of Oleic acid, 0.9 mmol of Sulfur, and 10 mL of TOP is stirred at 300° C. for 30 minutes to complete the reactant. 7) The reactant is cooled at room temperature, purified twice by precipitation using Toluene and Acetone, and then dispersed in Hexane. The prepared quantum dots have a core of InP, a first shell in which ZnSe is doped with Te, and a second shell of ZnS. In particular, the first shell has a composition of $ZnSe_{0.9}Te_{0.1}$.

Comparative Example 1: Quantum Dot of InP/ZnSe/ZnS 1) 1 mmol of Indium Acetate, 1 mmol of Zn Acetate, 5 mmol of Palmitic acid, 30 mL of 1-Octadecene are mixed and vacuum stirred at 120° C. for 1 hour. 2) 1 mmol of Tris(trimethylsilyl) Phosphine is injected into the reactant of a nitrogen environment at 300° C. to let it grow for 10 minutes. 3) 0.1 mmol of Selenium and 1 mL of Trioctylphosphine (TOP) is added to the reactant and stirred at 300° C. for 10 minutes. 4) A mixed solution of 1 mmol of Zn Acetate, 3 mmol of Oleic acid, 1 mmol of Selenium, and 10 mL of TOP is injected into the reactant at 320° C. and stirred for 10 minutes. 5) A mixed solution of 0.9 mmol of Zn Acetate, 2.7 mmol of Oleic acid, 0.9 mmol of Sulfur, and 10 mL of TOP is stirred at 300° C. for 30 minutes to complete the reaction. 6) The reactant is cooled at room temperature, purified twice by precipitation using Toluene and Acetone, and then dispersed in Hexane. The prepared quantum dots have a core of InP, a first shell of ZnSe, and a second shell of ZnS.

Comparative Example 2: Quantum Dot of $ZnSe_{0.9}Te_{0.1}$/ZnS 1) 1 mmol of Zn Acetate, 3 mmol of Oleic acid, and 30 mL of 1-Octadecene are mixed and vacuum stirred at 120° C. for 1 hour. 2) A mixed solution of 0.9 mmol of Selenium, 2.4 mL of Trioctylphosphine, 0.1 mmol of Tellurium, and 0.6 mL of Diphenylphosphine is injected into the reactant in a nitrogen environment at 300° C. to let it grow for 10 minutes. 3) A mixed solution of 0.9 mmol of Zn Acetate, 2.7 mmol of Oleic acid, 0.9 mmol of Sulfur, and 10 mL of TOP is stirred at 300° C. for 30 minutes to complete the reaction. 4) The reactant is cooled at room temperature, purified twice by precipitation using Toluene and Acetone, and then dispersed in Hexane. The prepared quantum dots have a core of ZnSe doped with Te and a first shell of ZnS.

Measurement of Absorbance of Each Wavelength Band of Quantum Dot

The absorbance of each wavelength band of the quantum dot according to embodiment and comparative examples was measured using QE-1100 of Otsuka Electronics. The measurement results are shown in FIG. 5.

Figure 5:
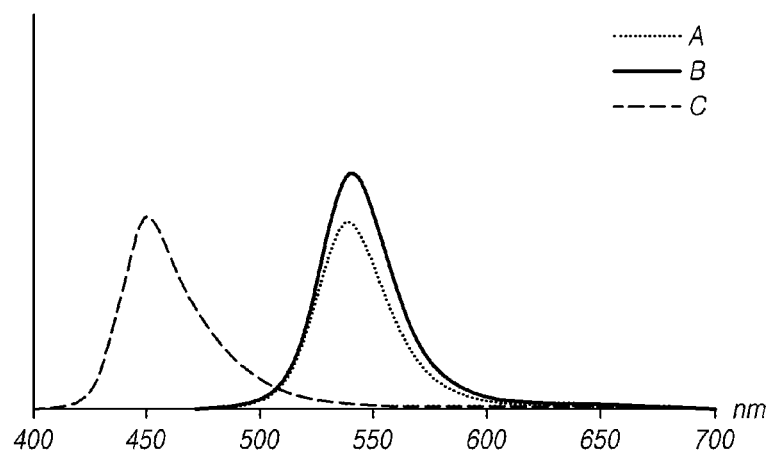
FIG. 5 illustrates a measurement of an absorbance of the quantum dot with respect to external light according to an embodiment of the present disclosure and a comparative example.

Referring to FIG. 5, A is the absorbance of the quantum dot according to the comparative example 1, B is the absorbance of the quantum dot according to the embodiment, and C is the absorbance according to the comparative example 2 of $ZnSe_{0.9}Te_{0.1}$/ZnS quantum dots is. It may be seen that the quantum dot according to the embodiment has better absorbance for 450 nm light than the quantum dot according to the comparative examples. Therefore, it is possible to provide quantum dot according to embodiments of the present disclosure having excellent absorbance for blue light.

Measurement of Luminescence Properties of Quantum Dot for 450 nm Light

Figure 6:
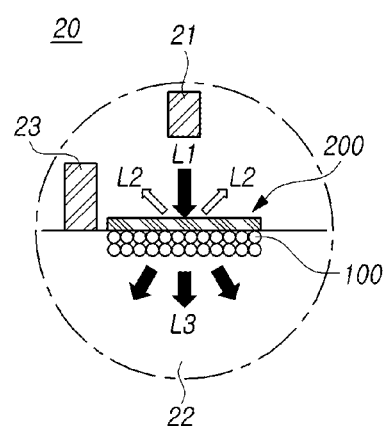
FIG. 6 illustrates a measurement of light emitted by quantum dots according to an embodiment of the present disclosure and a comparative example.

The light emission characteristics of the quantum dot according to the embodiment and the comparative examples with respect to 450 nm light were measured. Otsuka Electronics' QE-1100 was used for measurement, and the solutions formed in the embodiment and the comparative examples were fixed at an absorbance of 40% to 50% and irradiated with light at a wavelength of 450 nm in a hexane solvent to measure internal quantum efficiency (IQE). The results are shown in FIG. 6 and Table 1 below.

TABLE 1

| | Embodiment InP/ZnSe/ZnSe:Te/ZnS | Comparative Example 1 InP/ZnSe/ZnS | Comparative Example 2 ZnSe$_{0.9}$Te$_{0.1}$/ZnS |
|---|---|---|---|
| IQE | 87% | 85% | 67% |
| λmax | 541 nm | 538 nm | 452 nm |
| FWHM | 37 nm | 38 nm | 36 nm |

TABLE 2

| | Embodiment InP/ZnSe/ZnSe:Te/ZnS | Comparative Example 1 InP/ZnSe/ZnS |
|---|---|---|
| EQE | 26.5% | 22.3% |
| λmax | 544 nm | 542 nm |
| FWHM | 36 nm | 37 nm |
| Abs. (%) | 83.8% | 71.8% |

FIG. 6 illustrates a measurement of light emitted by quantum dots according to an embodiment of the present disclosure and a comparative example.

Referring to FIG. 6, it may be seen that the emitted light of the quantum dot according to the comparative example 2 is 450 nm, which is blue shifted from the emission wavelength of the quantum dot according to the embodiment and the comparative example 1. As described above with reference to FIG. 3, when the quantum dot emits light with a wavelength shifted to blue more than 545 nm, there may occur a problem when the of the quantum dot according to the comparative example 2 is applied to the display panel in that the luminance of the display panel is reduced. It may be also seen that the quantum dot according to the embodiment has higher quantum efficiency than the quantum dot according to the comparative example 1.

Referring to Table 1, it may be seen that the quantum dot according to the comparative example 2 have a problem that the IQE is significantly lower than that of the quantum dot according to the embodiment although the half maximum width (FWHM) is smaller than that of the quantum dot according to the embodiment. Comparing the comparative example 1 and the embodiment, it may be also seen that the quantum dot according to the embodiment has a higher IQE and a smaller half width than the quantum dot according to the comparative example 1, and the decrease in luminance ratio of the quantum dot according to the embodiment due to blue shift is smaller than that of the quantum dot of the comparative example 1.

Measurement of Optical Properties of Films Including Quantum Dot

Films including quantum dots according to the embodiment and the comparative example 1 were prepared. The thin films with a thickness of 10 μm were prepared by mixing 37 wt % of quantum dots with an acrylic resin, and quantum dots of InP/ZnSe:Te/ZnS according to the embodiment or quantum dots of InP/ZnSe/ZnS according to the comparative example 1 were used.

Figure 7:
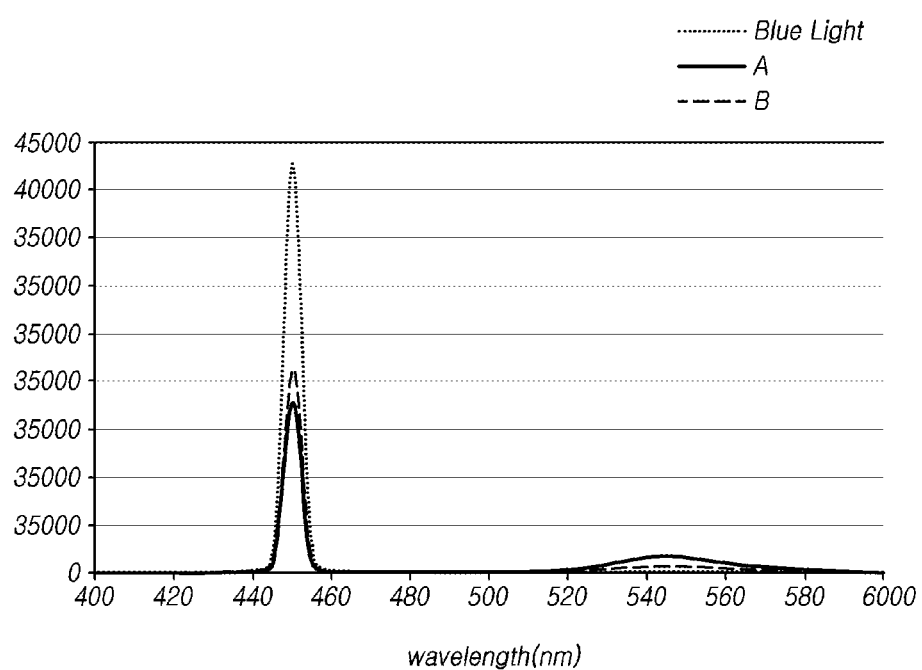
FIG. 7 illustrates a tool used to measure the light conversion.

The transmission mode of the prepared films was evaluated using the measuring device as shown in FIG. 7. When describing the example in which the optical properties of the film including the quantum dots according to the embodiment are measured using the measuring device 20, the measuring device 20 irradiate the blue light L1 emitted from the light source 21 to the film 200 including the quantum dots 100.

One portion L2 of the irradiated light L1 is lost without being converted by the quantum dot 100, and the other part L3 thereof is converted by the quantum dot 100 and reaches the integrating hemisphere 22, the reaching lights are detected by the detector 23. The measurement results of external quantum efficiency (EQE) through the measuring device 20 are shown in FIGS. 8 and 9, and Table 2 below.

Figure 8:
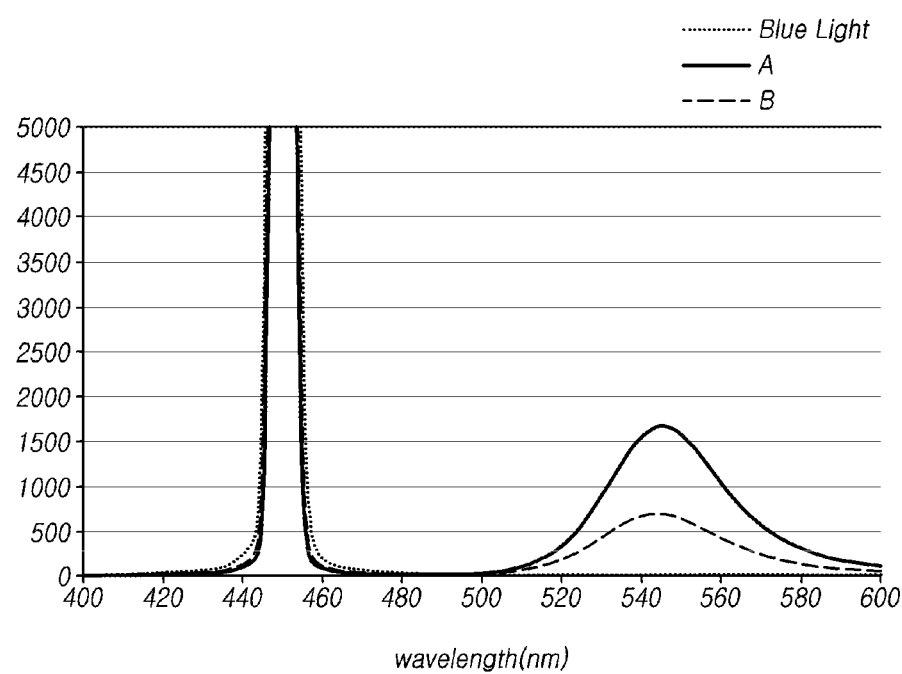
FIG. 8 illustrates measurements of light conversion efficiency of films including the quantum dot according to an embodiment of the present disclosure and a comparative example.

FIGS. 7 and 8 illustrate measurements of light conversion efficiency of films including the quantum dot according to an embodiment of the present disclosure and a comparative example. A is the light converted by the film including the quantum dots according to comparative example 1, and B shows the light converted by the film including the quantum dots according to the embodiment.

Referring to FIG. 8 and Table 2, it may be seen that the film including the quantum dots according to the embodiment absorbs more blue light of 440 nm to 460 nm than the film including the quantum dots according to the comparative example 1 (see Abs. (%) in Table 2).

Referring to FIG. 8 and Table 2, it may be seen that the external quantum efficiency (EQE) of the film including the quantum dots according to the embodiment is improved compared to that of the film including the quantum dots according to the comparative example 1, and the half width of the former is smaller than that of the latter. In addition, it may be seen that since the film including the quantum dots according to the embodiment has a blue shift less than 545 nm, a display panel and a display device including the quantum dots may have better luminance.

The above description has been presented to enable any person skilled in the art to make and use the technical idea of the present disclosure, and has been provided in the context of a particular application and its technical benefits. Various modifications, additions and substitutions to the described embodiments will be readily apparent to those skilled in the art, and the general principles described herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A quantum dot, comprising:
   a core including a group III-V compound;
   a first shell including a second semiconductor nanocrystal, the second semiconductor nanocrystal including:
      zinc,
      selenium, and
      a dopant including tellurium; and
   a second shell including a third semiconductor nanocrystal, the third semiconductor nanocrystal including a II-VI compound,
   wherein:
   the dopant of tellurium is positioned at an interface between the first shell and the second shell;
   the molar ratio of tellurium to selenium in the first shell is in a range of 5:95 to 50:50; and
   the molar ratio of tellurium to zinc in the first shell is in a range of 6:94 to 35:65.

2. The quantum dot according to claim 1, wherein the core comprises a first semiconductor nanocrystal including indium and phosphorus.

3. The quantum dot according to claim 1, wherein the third semiconductor nanocrystal comprises zinc and sulfur.

4. The quantum dot according to claim 1, wherein a maximum emission wavelength λmax of the quantum dot is in a range of 540 nm to 550 nm when the quantum dot is irradiated by light having a wavelength of 440 nm to 460 nm.

5. The quantum dot according to claim 1, wherein a quantum yield of the quantum dot is 86% or more and a half width of the quantum dot is 40 nm or less.

6. A display panel, comprising:
   a light source configured to emit light having a wavelength of substantially 450 nm, the light having a first color; and
   a wavelength conversion layer positioned on a path of the light emitted from the light source, the wavelength conversion layer including a quantum dot configured to convert the light having the first color into light having a second color, and the quantum dot including:
      a core comprising a group III-V compound;
      a first shell including a second semiconductor nanocrystal, the second semiconductor nanocrystal including:
         zinc,
         selenium, and
         a dopant including tellurium; and
      a second shell including a third semiconductor nanocrystal, the third semiconductor nanocrystal including a II-VI compound,
   wherein:
   the dopant of tellurium is positioned at an interface between the first shell and the second shell;
   the molar ratio of tellurium to selenium in the first shell is in a range of 5:95 to 50:50; and
   the molar ratio of tellurium to zinc in the first shell is in a range of 6:94 to 35:65.

7. The display panel according to claim 6, wherein the first color is blue and the second color is green.

8. The display panel according to claim 6, further comprising:
   a color filter positioned on a path of the light having the second color.

9. A display device, comprising a display panel and a controller configured to control the display panel, wherein the display panel comprises:
   a light source configured to emit light having a wavelength of substantially 450 nm, the light having a first color; and
   a wavelength conversion layer positioned on a path of the light emitted from the light source, the wavelength conversion layer including a quantum dot configured to convert the light having the first color into light having a second color, and the quantum dot including:
      a core comprising a group III-V compound;
      a first shell including a second semiconductor nanocrystal, the second semiconductor nanocrystal including:
         zinc,
         selenium, and
         a dopant including tellurium; and
      a second shell including a third semiconductor nanocrystal, the third semiconductor nanocrystal including a II-VI compound,
   wherein:
   the dopant of tellurium is positioned at an interface between the first shell and the second shell;
   the molar ratio of tellurium to selenium in the first shell is in a range of 5:95 to 50:50; and
   the molar ratio of tellurium to zinc in the first shell is in a range of 6:94 to 35:65.

* * * * *